United States Patent
Cao et al.

(10) Patent No.: US 10,995,232 B2
(45) Date of Patent: May 4, 2021

(54) FLEXIBLE CONDUCTIVE INK

(71) Applicants: Henkel IP & Holding GmbH, Duesseldorf (DE); Ablestik (Shanghai) Co. Ltd., Shanghai (CN); Henkel AG & Co. KGAA, Duesseldorf (DE)

(72) Inventors: Jie Cao, Hillsborough, NJ (US); Jose Garcia-Miralles, Barcelona (ES); Allison Yue Xiao, Belle Mead, NJ (US); Rudie Oldenzijl, Hoogezand (NL); Gunther Dreezen, Balen-Olmen (BE); Qili Wu, Shanghai (CN); Jianping Chen, Irvine, CA (US)

(73) Assignees: HENKEL AG & CO. KGAA, Duesseldorf (DE); HENKEL IP & HOLDING GMBH, Duesseldorf (DE)

( * ) Notice: Subject to any disclaimer, the term of this patent is extended or adjusted under 35 U.S.C. 154(b) by 200 days.

(21) Appl. No.: 14/804,469

(22) Filed: Jul. 21, 2015

(65) Prior Publication Data

US 2015/0322276 A1 Nov. 12, 2015

Related U.S. Application Data

(63) Continuation of application No. PCT/CN2013/070887, filed on Jan. 23, 2013.

(51) Int. Cl.
| | | |
|---|---|---|
| *C09D 11/52* | (2014.01) | |
| *H05K 3/12* | (2006.01) | |
| *C09D 11/10* | (2014.01) | |
| *H05K 1/09* | (2006.01) | |
| *C09D 11/037* | (2014.01) | |

(52) U.S. Cl.
CPC ............ *C09D 11/52* (2013.01); *C09D 11/037* (2013.01); *C09D 11/10* (2013.01); *H05K 1/095* (2013.01); *H05K 3/12* (2013.01); *H05K 2201/0218* (2013.01); *H05K 2201/0245* (2013.01); *H05K 2201/0272* (2013.01)

(58) Field of Classification Search
CPC . C09D 11/52; H05K 3/12; H05K 1/00; H05K 2201/0272; H05K 2201/0218
See application file for complete search history.

(56) References Cited

U.S. PATENT DOCUMENTS

| | | | |
|---|---|---|---|
| 4,371,459 A | 2/1983 | Nazarenko | |
| 4,425,263 A | 1/1984 | Nazarenko | |
| 5,089,173 A | 2/1992 | Frentzel et al. | |
| 5,653,918 A | 8/1997 | Towlson | |
| 6,939,484 B2 | 9/2005 | Dorfman | |
| 2002/0062990 A1* | 5/2002 | Kikuchi | H05K 3/4069 174/264 |
| 2008/0169122 A1* | 7/2008 | Shiraishi | C09D 11/52 174/257 |
| 2008/0246007 A1* | 10/2008 | Gellrich | B05D 3/0254 252/500 |
| 2009/0020733 A1* | 1/2009 | Hirakawa | H01B 1/22 252/519.33 |
| 2009/0169724 A1* | 7/2009 | Ogiwara | H01B 1/22 427/77 |
| 2010/0021625 A1* | 1/2010 | Dorfman | C08K 3/08 427/75 |

FOREIGN PATENT DOCUMENTS

| | | |
|---|---|---|
| CN | 102559090 A | 7/2012 |
| CN | 102559092 A | 7/2012 |
| JP | 2007019006 A | 1/2007 |
| JP | 2008094997 A | 4/2008 |
| JP | 2009-230952 | * 10/2009 |
| JP | 2009230952 A | 10/2009 |
| JP | 2010043228 A | 2/2010 |
| JP | 2010047649 A | 3/2010 |
| JP | 2010059409 A | 3/2010 |
| JP | 2010235738 A | 10/2010 |
| JP | 2012246433 | 5/2011 |
| WO | 2009035453 A1 | 3/2009 |
| WO | 2010101418 A2 | 9/2010 |
| WO | 2011110626 A1 | 9/2011 |

OTHER PUBLICATIONS

International Search Report for International Application No. PCT/CN2013/070887 dated Oct. 17, 2013.

* cited by examiner

*Primary Examiner* — Tabassom Tadayyon Eslami
(74) *Attorney, Agent, or Firm* — Sun Hee Lehmann

(57) ABSTRACT

This invention is a flexible conductive ink composition comprising (A) a resin binder, (B) silver-plated core conductive particles, and (C) conductive particles having a surface area at least 1.0 m²/g.

12 Claims, No Drawings

FLEXIBLE CONDUCTIVE INK

BACKGROUND OF THE INVENTION

This invention relates to flexible conductive ink compositions for use in membrane touch switch or flexible printed-wiring board applications. The composition comprises a binder and conductive filler in which at least a portion of the filler is silver-plated conductive particles.

The electronics industry demands both good initial conductivity and good flexibility for conductive inks. Good flexibility is needed so that circuitry prepared from the conductive ink can be bent when compacted into housing for the newest electronic devices, which are lighter, thinner, and smaller. Typical flexible conductive ink compositions use flexible resin binders to achieve flexibility. The drawback of using flexible resins is that the resins have low surface hardness and poor anti-scratch resistance, properties necessary for the end use electronic applications. Halogen containing resins have a higher surface hardness, but the presence of halogens is usually environmentally undesired.

In order to obtain good initial conductivity pure silver flake with low surface area and high tap density is required. However, the use of conductive silver flakes with low surface area and high tap density adversely affects the flexibility of the conductive ink. Moreover, the cost of silver is very high. The electronics industry has started to use silver-plated copper to replace silver in conductive inks to achieve cost reduction. The problem with this approach is that copper is considerably more rigid than silver. Bulk Modulus for copper is $1.378 \times 10^{11}$ $Nm^{-2}$ and for silver is $1.036 \times 10^{11}$ $Nm^{-2}$. This means that conductive inks with silver coated copper particles have considerably less flexibility than inks with pure silver particles.

Some prior art compositions use polyester resins, or phenoxy resins, or a combination of phenoxy resin and urethane resin in an organic solvent with pure silver filler. The sheet resistivity of these compositions is low and the flexibility ranges from good to adequate. For the urethane containing compositions, the presence of the urethane leads to a lowering of the glass transition temperature (Tg) and a compromise of the mechanical properties. For all the compositions in which only bulk silver is used for good conductivity and flexibility, cost is an issue. Simply reducing silver loading will not solve the cost problem, because a reduced silver loading leads to poor film performance and lower conductivity. This creates a need for conductive compositions that have the right properties for membrane touch switches and flexible circuit boards and a lower cost compared to compositions containing solely bulk silver loadings.

SUMMARY OF THE INVENTION

This invention is a flexible conductive ink composition comprising (A) a resin binder, (B) silver-plated core conductive particles, and (C) conductive particles having a surface area at least 1.0 $m^2/g$, characterized in that the flexibility of the composition is higher than the flexibility of a composition without (C) conductive particles. Solvent is added in the preparation of the composition as needed to reach a usable viscosity for mixing and dispensing. Solvent is not included in the weight percentages of components for the inventive compositions.

These compositions achieve good initial conductivity and improved flexibility over the same compositions that do not contain conductive particles having a surface area at least 1.0 $m^2/g$, and they command a lower cost over compositions using solely bulk silver. The flexible conductive ink compositions of this invention are particularly suitable for membrane touch switch applications, which are widely used for keyboard and electric switches, because they provide high conductivity, high flexibility, and low cost.

In another embodiment this invention is a process for making a conductive film for use in a membrane touch switch device or a flexible circuit. The process comprises dispersing the flexible electrically conductive composition of the invention (with solvent as needed) onto a membrane touch switch substrate to form conductive circuits and/or electrodes, and then drying the composition to remove the solvent.

DETAILED DESCRIPTION OF THE INVENTION

Within this specification and claims conductive particles having a surface area at least 1.0 $m^2/g$ may be referred to as large surface area conductive particles, or LSA conductive particles, and conductive particles having a surface area smaller than 1.0 $m^2/g$ may be referred to as small surface area conductive particles, or SSA conductive particles; and composition component weight percents are the weight percents of the dry composition, that is, excluding the solvent.

Suitable binder resins are thermoplastic resins, chosen to reach desired conductivity and flexibility and adequate impact or scratch resistance for the targeted end use. Suitable thermoplastic polymers include, but are not limited to, polyesters, phenoxy resins, phenolic resins, acrylic polymers, acrylic block copolymers, acrylic polymers having tertiary-alkyl amide functionality, polysiloxane polymers, polystyrene copolymers, polyvinyl polymers, divinylbenzene copolymers, polyetheramides, polyvinyl acetals, polyvinyl butyrals, polyvinyl acetols, polyvinyl alcohols, polyvinyl acetates, polyvinyl chlorides, methylene polyvinyl ethers, cellulose acetates, styrene acrylonitriles, amorphous polyolefins, thermoplastic urethanes, polyacrylonitriles, ethylene vinyl acetate copolymers, ethylene vinyl acetate terpolymers, functional ethylene vinyl acetates, ethylene acrylate copolymers, ethylene acrylate terpolymers, ethylene butadiene copolymers and/or block copolymers, styrene butadiene block copolymers.

Suitable commercially available binders include those sold under the product designations ESTANE 5703P, which is a thermoplastic polyurethane available from The Lubrizol Corporation, Cleveland, Ohio, USA; those sold under the product designation VITEL 220B, which is polyester type thermoplastic from Bostik Findley, Inc; and those sold under the product designations PKHB, PKHC, PKHH, PKHJ, and PKFE, which are phenoxy resins available from Inchem, S.C., USA.

The preferred binder is a phenoxy resin because it has low or no reactivity and appropriate hardness.

The total binder content is in the range of 2 to 60 weight percent of the total dry composition; in another embodiment the total binder content is in the range of 5 to 30 weight percent of the total dry composition.

Conductive particles with a surface area smaller than 1.0 $m^2/g$ are referred to as small surface area, SSA, conductive particles and are typically used as a replacement for elemental conductive particles, such as silver, to reduce costs. The SSA particles can have either a conductive core or a non-conductive core. A combination of silver-plated fillers, with conductive cores and non-conductive cores, may be used. In all cases, the silver content of the silver-plated conductive filler must be sufficient to provide adequate electrical conductivity for a selected end use device, which can be determined by one skilled in the art without undue experimentation.

For the SSA silver-plated core particles, exemplary conductive cores include, but are not limited to, copper, nickel, palladium, carbon black, carbon fiber, graphite, aluminum, and indium tin oxide; exemplary non-conductive cores include, but are not limited to, glass, polymers, antimony doped tin oxide, silica, alumina, fiber, and clay.

In the embodiment in which the core of the silver-plated particle is copper, the silver content of the silver-plated copper will be sufficient to provide adequate electrical conductivity for a variety of end use devices when the silver content of the silver-plated copper is within the range of 5 to 30 weight percent silver.

In the embodiment in which the core of the silver-plated filler particle is graphite, the silver content of the silver-plated graphite will be sufficient to provide adequate electrical conductivity for a variety of end use devices when the silver content of the silver-plated graphite is within the range of 30 to 80 weight percent silver.

The SSA silver-plated conductive particles comprise in the range of 1 to 97.9 weight percent of the total dry composition and preferably in the range of 30 to 92 weight percent of the total dry composition.

In order to obtain the needed flexibility in conductive inks, the inventors discovered that the addition of conductive particles with a surface area at least 1.0 m$^2$/g would improve flexibility. Thus, conductive particles that have a surface area larger than the silver-plated conductive particles are utilized in the composition in addition to the silver-plated conductive filler particles. These LSA particles preferably have a surface area 1.0 m$^2$/g or larger and are added to achieve sufficient flexibility and conductivity in the compositions. Any electrically conductive LSA particles that provide sufficient flexibility and conductivity for the desired end use may be utilized. The LSA particles are not restricted to bulk metallic or conductive particles (that is, those without a core), but include even metallic-plated core particles provided they have the requisite large surface area. The LSA particles will be present in the range of 0.1 to 70 weight percent of the total dry composition and preferably in the range of 3 to 60 weight percent of the total dry composition. The average particle size of the LSA conductive filler is preferably in the range of 1 to 100 μm, more preferably in the range of 5 to 20 μm.

Exemplary LSA conductive particles include, but are not limited to, silver, gold, palladium, platinum, carbon black, carbon fiber, graphite, indium tin oxide, silver-plated nickel, silver-plated copper, silver-plated graphite, silver-plated aluminum, silver-plated fiber, silver-plated glass, silver-plated polymer, and antimony-doped tin oxide. Other metal-plated particles may be used, provided that the conductivity is sufficient for the desired end use.

As needed to enable efficient dispensing, the viscosity of the composition can be adjusted with solvents. Viscosities within the range of 50 to 150,000 mPa·s are suitable for many means of dispensing. For rotogravure or flexo printing, a suitable viscosity is within the range of 500 to 4,000 mPa·s; for stencil or screen printing, a suitable viscosity is within the range of 4,000 to 50,000 mPa·s. The total amount of solvent is not critical, but is adjusted to obtain a useful viscosity.

Exemplary solvents, which may be utilized either separately or in combination, include 1,4-butanediol diglycidyl ether, p-tert-butyl-phenyl glycidyl ether, allyl glycidyl ether, glycerol diglycidyl ether, butyldiglycol, 2-(2-butoxyethoxy)-ethylester, butylglycolacetate, acetic acid, 2-butoxyethylester, butylglycol, 2-butoxyethanol, isophorone, 3,3,5 trimethyl-2-cyclohexene-1-one, dimethylsuccinate, dimethylglutarate, dimethyladipate, acetic acid, dipropylene glycol (mono)methyl ether, propylacetate, glycidyl ether of alkyl phenol (commercially available from Cardolite Corporation as Cardolite NC513), and refined dimethyl esters of adipic, glutaric, and succinic acids (commercially available as DPE Dibasic Esters from Invista).

Preferred solvents are those with a flash point above 70° C., and include the following, where b.p. is the boiling point and f.p. is the flash point: butyl glycol acetate (b.p. 192.3° C., f.p. 87° C.), carbitol acetate (b.p. 217.4° C., f.p. 109° C.), glycol ether (DOWANOL DPM, b.p.190° C., f.p. 75° C.), dibasic esters, such as, the dimethyl esters of adipic, glutaric, and succinic acids (DPE, b.p. 196-225° C., f.p. 94° C.), dibasic ester (DBE-9, b.p. 196-215° C., f.p. 94° C.), and ethyl glycol (CARBITOL, b.p. 201.9° C., f.p. 83° C.).

Additional organic additives may be included in the formulation to provide desired properties. Various additives typically used include surface active agents, surfactants, wetting agents, antioxidants, thixotropes, reinforcement fibers, silane functional perfluoroether, phosphate functional perfluoroether, titanates, wax, phenol formaldehyde, air release agents, flow additives, adhesion promoters, rheology modifiers, and spacer beads. The additional ingredients are optional, and are specifically chosen to obtain any desired properties for the chosen end use. When used, the additives can comprise up to about 10 weight percent of the total dry composition.

Another aspect of the current invention is a process for making a membrane touch switch film. The composition is first mixed to form a uniform paste, is applied onto a substrate to form conductive traces or electronic circuitry, and then is dried at 90° C. to 180° C. for 5 to 60 minutes. The stated drying conditions are typical, but can be outside this range when required for adequate drying. Usual methods of applying the composition to a substrate include dispensing by stencil, screen, rotogravure or flexo printing, with screen printing being generally used for membrane touch switch applications.

EXAMPLES

Inventive compositions were tested for conductivity measured as sheet resistivity, and for flexibility measured as the change in conductivity after creasing.

Suitable sheet resistivities for conductivity for electronic devices typically will be no greater than 50 mOhm/square at 25 μm; in other embodiments, no greater than 30 mOhm/square at 25 μm; in further embodiments, no greater than 20 mOhm/square at 25 μm.

The sheet resistivity (SR) was measured using a Keithley 2010 multimeter with a four point probe mounting stand (Lucas Labs 302) and the coating thickness, T, was measured using a digimatic indicator (Model 543-452B by Mitutoya).

The sheet resistivity was calculated as follows:

$$SR=(R(tr) \times W(tr) \times T(tr))/(L(tr) \times 25) \text{ where}$$

R(tr)=Resistance of the track (in Ohm)
W(tr)=Width of the track (in mm)
T(tr)=Thickness of the track (in μm)
L(tr)=Length of the track (in mm).

The flexibility of the inventive compositions was measured as the percent change in sheet resistivity after a conductive track of the composition was creased. After creasing most compositions have an increase in sheet resistivity as some of the conductive track is impaired. The crease test was performed as follows. A conductive track of the composition was laid on a PET flexible substrate and the resistance measured and calculated. The substrate was then folded in half with the conductive track on the outside. The fold was creased by rolling a 1800 g weight over the fold. The substrate was opened and folded along the same crease, this time with the track on the inside. The fold was again creased by rolling a 1800 g weight over the fold. The substrate was unfolded, held for one minute, and the sheet resistivity measured and calculated as before. The percentage change in sheet resistivity was calculated and the results reported in the tables associated with the examples.

Conductive fillers used in the following examples were obtained commercially from several vendors. The silver particles or silver-plated particles used in the examples had the tap densities and surface areas reported in Table 1.

TABLE 1

| Silver or Silver-plated Particles | Tap Density (g/cc) | Surface Area (m²/g) |
|---|---|---|
| SPG-1 (silver-plated graphite) | 0.71 | 2.3 |
| Ag-1 (silver flake) | 0.7-1.5 | 1.4-2.1 |
| Ag-2 (silver flake) | 3.2-5.7 | 0.3-0.75 |
| Ag-3 (silver flake) | 4.34 | 0.53 |
| Ag-4 (silver flake) | 2.5-3.8 | 1.15-1.75 |
| Ag-5 (silver flake) | 3.5 | 1.99 |
| Ag-6 (silver flake) | 1.0 | 5.6 |
| SPC-1 (silver-plated copper) | 3.1 | 0.58 |
| SPC-2 (silver-plated copper) | 2.6 | 0.78 |
| SPC-3 (silver-plated copper) | 3.7 | 0.45 |

The resin used in the examples, unless otherwise stated, is a phenoxy resin, PKHC, from Inchem Corporation, S.C., USA. The resin is a linear thermoplastic resin made by reacting epichlorohydrin with bisphenol A and has a glass transition temperature (Tg) of 89° C. and an elastic modulus of $2.576 \times 10^9$ Pa (373,600 psi). The solvent was butyl glycol acetate, unless otherwise stated.

Test samples were prepared by mechanically mixing the components to form a uniform paste, screen printing the compositions onto a flexible PET substrate (125 μm thick) to form conductive tracks at a width of 2 mm or 5 mm, and drying the composition tracks at 90° C. to 180° C. for 5 to 60 minutes. The initial sheet resistivity was then measured and calculated as described above. The substrate with tracks was then creased as described above, and the resistivity thereafter measured and calculated to determine flexibility.

In the following tables, the weights of the composition components are given in grams; with respect to the conductive filler particles, SSA means "small surface area", that is less than 1.0 m²/g, and LSA means "large surface area", that is 1.0 m²/g or larger. Weight percentages of components exclude solvent.

Example 1 (Comparative)

Performance of Ink Compositions Containing SSA Silver Flakes

Conductive ink compositions were prepared using the SSA silvers Ag-2 and Ag-3 from Table 1. The compositions were tested for conductivity and flexibility. The composition formulation (weights in grams) and results are reported in the following table. The data show that although the conductivity is acceptable, the flexibility is poor, as indicated by the large percentage increase in resistivity after the crease test.

| Example 1 | 1A | 1B | 1C | 1D |
|---|---|---|---|---|
| Ag-2 | 1.25 | 1.75 | | |
| Ag-3 | | | 1.25 | 1.75 |
| Resin PKHC | 0.25 | 0.25 | 0.25 | 0.25 |
| Solvent butyl glycol acetate | 0.75 | 0.75 | 0.75 | 0.75 |
| Initial SR (mOhm/sq at 25 | 29.7 | 12.9 | 61.5 | 21.0 |
| % SR increase after crease test | 11866.9 | 154.3 | 203231.5 | 372.7 |

Example 2 (Comparative)

Performance of Ink Compositions Containing LSA Silver Flakes

Conductive ink compositions were prepared using the LSA silver Ag-1 from Table 1. The compositions were tested for conductivity and flexibility. The composition formulation (weights in grams) and results are reported in the following table. The data show that both the conductivity and flexibility are good. The disadvantage is the high cost of compositions in which bulk silver is the sole conductive filler, as it is in these formulations.

| Example 2 | 2A | 2B |
|---|---|---|
| Ag-1 | 1.25 | 1.75 |
| Resin PKHC | 0.25 | 0.25 |
| Solvent butyl glycol acetate | 0.75 | 0.75 |
| Initial SR (mOhm/sq at 25 μm) | 33.0 | 95.0 |
| % SR increase | 9.0 | 41.0 |

Example 3 (Comparative)

Performance of Ink Compositions Containing SSA Silver-Plated Copper Flakes

Conductive ink compositions were prepared using the SSA silver-plated copper flakes SPC-1, SPC-2 and SPC-3 from Table 1. The compositions were tested for conductivity and flexibility. The composition formulation (weights in grams) and results are reported in the following table. The data show that although the conductivity is good, the flexibility of the compositions using SSA silver-plated copper flakes is unacceptable as indicated by the large increase in resistivity after the crease test.

| Example 3 | 3A | 3B | 3C | 3D |
|---|---|---|---|---|
| SPC-1 | 1.75 | | | |
| SPC-2 | | 1.75 | | |
| SPC-3 | | | 1.75 | |
| SPC-3 | | | | 2.33 |
| Resin PKHC | 0.25 | 0.25 | 0.25 | 0.25 |
| Solvent butyl glycol acetate | 0.75 | 0.75 | 0.75 | 0.75 |
| Initial SR (mOhm/sq at 25 μm) | 31.0 | 21.0 | 16.8 | 15.8 |
| % SR increase | ∞ | ∞ | 287.6 | 188.0 |

Example 4 (Comparative)

Performance of Ink Compositions Containing SSA Silver-Plated Copper Flakes and SSA Silver Flakes Conductive ink compositions were prepared using the SSA silver-plated copper flake SPC-3 and silver AG-3 from Table 1. The compositions were tested for conductivity and flexibility. The composition formulation (weights in grams) and results are reported in the following table. The data show that the flexibility of the compositions containing a combination of SSA silver-plated copper flakes and SSA silver flakes is unacceptable, as indicated by the large increase in resistivity after the crease test.

| Example 4 | 4A | 4B |
|---|---|---|
| Ag-3 | 0.6 | 0.75 |
| SPC-3 | 0.65 | 0.80 |
| Resin PKHC | 0.25 | 0.25 |
| Solvent butyl glycol acetate | 0.75 | 0.75 |
| Initial SR (mOhm/sq at 25 μm) | 22.1 | 15.4 |
| % SR increase | 453.6 | 207.5 |

Example 5

Performance of Ink Compositions Containing SSA Silver-Plated Copper Flakes and LSA Silver Flakes Conductive ink compositions were prepared using the SSA silver-plated copper flake SPC-3 and the LSA silver AG-1 from Table 1. The compositions were tested for conductivity and flexibility. The composition formulation (weights in grams) and results are reported in the following table. The data show that the flexibility of the compositions containing a combination of SSA silver-plated copper flakes and LSA silver flakes is improved over the flexibility of the compositions in the previous examples without the LSA conductive particles. Moreover, this is achieved while reducing cost due substituting silver-plated copper flakes for a portion of the bulk silver flakes typically used.

| Example 5 | 5A | 5B | 5C | 5D | 5E | 5F | 5G | 5H | 5J |
|---|---|---|---|---|---|---|---|---|---|
| Ag-1 | 0.1 | 0.20 | 0.35 | 0.55 | 0.75 | 1.0 | 0.60 | 0.20 | 0.10 |
| SPC-3 | 1.45 | 1.45 | 1.20 | 1.00 | 0.80 | 0.55 | 0.65 | 1.20 | 1.30 |
| Resin PKHC | 0.25 | 0.25 | 0.25 | 0.25 | 0.25 | 0.25 | 0.25 | 0.25 | 0.25 |
| Solvent butyl glycol acetate | 0.75 | 0.75 | 0.75 | 0.75 | 0.75 | 0.75 | 0.75 | 0.75 | 0.75 |
| Initial SR (mOhm/sq at 25 μm) | 18.9 | 18.8 | 17.3 | 14.5 | 12.3 | 17.4 | 14.9 | 14.0 | 66.0 |
| % SR increase | 132.8 | 146.4 | 76.7 | 71.2 | 53.7 | 52.1 | 31.8 | 31.0 | 54.0 |
| % Improvement over comparative ex 3D | 29.4 | 22.1 | 59.2 | 62.1 | 71.4 | 72.3 | 83.1 | 83.5 | 71.3 |
| Total Filler wt % | 86.1 | 86.8 | 86.1 | 86.1 | 86.1 | 86.1 | 83.8 | 84.8 | 84.8 |
| LSA Filler wt % | 5.6 | 10.5 | 19.4 | 30.6 | 41.7 | 55.6 | 40.0 | 12.1 | 6.1 |

| Example 5 | 5K | 5L | 5M | 5N | 5O | 5P |
|---|---|---|---|---|---|---|
| SPC-3 | 1.2 | 1.3 | 1.2 | 1.3 | 1.2 | 1.3 |
| Ag-1 | 0.2 | 0.1 | | | | |
| Ag-4 | | | 0.2 | 0.1 | | |
| Ag-5 | | | | | 0.2 | 0.1 |
| Resin PKHC | 0.25 | 0.25 | 0.25 | 0.25 | 0.25 | 0.25 |
| Solvent butyl glycol acetate | 0.75 | 0.75 | 0.75 | 0.75 | 0.75 | 0.75 |
| Initial SR (mOhm/sq at 25 μm) | 16 | 20 | 18 | 19 | 18 | 18 |
| % SR increase | 32 | 45 | 93 | 77 | 50 | 126 |
| % Improvement over comparative ex 3D | 83.0 | 76.1 | 50.5 | 59.0 | 73.4 | 33 |
| Total Filler wt % | 84.8 | 84.8 | 84.8 | 84.8 | 84.8 | 84.8 |
| LSA Filler wt % | 12.1 | 6.1 | 12.1 | 6.1 | 12.1 | 6.1 |

| Example 5 | 5Q | 5R | 5S | 5T | 5U | 5V | 5W |
|---|---|---|---|---|---|---|---|
| SPC-3 | 0.58 | 0.52 | 0.45 | 0.39 | 0.324 | 0.26 | 5.5 |
| Ag-1 | 0.54 | 0.48 | 0.42 | 0.36 | 0.3 | 0.24 | |
| Ag-6 | | | | | | | 1.0 |
| Resin PKHJ | | | | | | | 1.25 |
| Resin PKHC | 0.25 | 0.25 | 0.25 | 0.25 | 0.25 | 0.25 | |
| Solvent butyl glycol acetate | 0.75 | 0.75 | 0.75 | 0.75 | 0.75 | 0.75 | |
| Solvent carbitol acetate | | | | | | | 3.75 |
| Initial SR (mOhm/sq at 25 μm) | 14.5 | 17.7 | 25 | 34 | 53.9 | 109.5 | 27 |
| % SR increase | 48.8 | 49.5 | 56.3 | 38 | 47.7 | 70 | 43 |
| % Improvement over comparative ex 3D | 74.0 | 73.7 | 70.0 | 79.8 | 74.6 | 62.8 | 77.1 |
| Total Filler wt % | 81.8 | 80 | 77.7 | 75 | 71.4 | 66.7 | 83.9 |
| LSA Filler wt % | 39.4 | 38.4 | 37.5 | 36 | 34.3 | 32 | 12.9 |

Example 6

Performance of Ink Compositions Containing SSA Silver-Plated Copper Flakes and LSA Silver-Plated Graphite Flakes Conductive ink compositions were prepared using the SSA silver-plated copper flakes SPC-3 and LSA silver-plated graphite flakes SPG-1. The compositions were tested for conductivity and flexibility. The composition formulations (weights in grams) and results are reported in the following table. The data show that the flexibility of the compositions containing a combination of SSA silver coated copper flakes and LSA silver-plated graphite flakes provides a composition with acceptable conductivity and an improvement in flexibility over the example 3D composition containing only SSA silver-plated copper flakes. Moreover, this is achieved while at the same time reducing cost by including the higher surface area silver-plated graphite flakes in the composition rather than high surface area silver flakes.

| Example 6 | 6A | 6B | 6C | 6D |
|---|---|---|---|---|
| SPG-1 | 0.100 | 0.100 | 0.100 | 0.088 |
| SPC-3 | 2.000 | 2.400 | 2.800 | 1.412 |
| Resin PKHC | 0.25 | 0.25 | 0.25 | 0.25 |
| Solvent Butyl glycol acetate | 0.75 | 0.75 | 0.75 | 0.75 |
| Initial SR (mOhm/sq at 25 μm) | 21.8 | 18.9 | 17.7 | 31.9 |
| % SR increase | 154.2 | 171.9 | 156.5 | 134.1 |
| % Improvement over comparative ex 3D | 18 | 8.5 | 16.7 | 28.7 |
| Total Filler wt % | 89.4 | 90.9 | 92.1 | 85.7 |
| LSA Filler wt % | 4.3 | 3.6 | 3.2 | 5.0 |

Example 7 (Comparative)

Performance of Ink Compositions Containing SSA Silver-Plated Copper Flakes, SSA Silver Flakes, and LSA Silver-plated Graphite Flakes Conductive ink compositions were prepared using the SSA silver-plated copper flakes SPC-3, SSA silver flakes Ag-2 or Ag-3, and LSA silver-plated graphite flakes SPG-1 from Table 1. The compositions were tested for conductivity and flexibility. The composition formulations (weights in grams) and results are reported in the following table and show that in this case the level of high surface area silver-plated graphite is not sufficient to bring the flexibility to the desired level and still maintain the desired conductivity.

| Example 7 | 7A | 7B | 7C | 7D | 7E |
|---|---|---|---|---|---|
| SPG-1 | 0.100 | 0.050 | 0.030 | 0.050 | 0.030 |
| Ag-2 | 0.100 | 0.200 | 0.120 | | |
| Ag-3 | | | | 0.200 | 0.120 |
| SPC-3 | 1.450 | 0.850 | 0.900 | 0.850 | 0.900 |
| Resin PKHC | 0.25 | 0.25 | 0.25 | 0.25 | 0.25 |
| Solvent butyl glycol acetate | 0.75 | 0.75 | 0.75 | 0.75 | 0.75 |
| SR (mOhm/sq at 25 μm) | 21.1 | 25.6 | 27.4 | 25.6 | 27.0 |
| % SR increase | 180.4 | 292.1 | 603.5 | 240.0 | 569.8 |

Example 8

Performance of Ink Compositions Containing SSA Silver-Plated Copper Flakes, LSA Silver Flakes, and LSA Silver-Plated Graphite Flakes Conductive ink compositions were prepared using the SSA silver-plated copper flakes SPC-3, LSA silver flakes Ag-1, and LSA silver-plated graphite flakes SPG-1 from Table 1. The compositions were tested for conductivity and flexibility. The composition formulations (weights in grams) and results are reported in the following table and show that the addition of the larger surface area silver flakes improves the flexibility performance of the samples compared to those of Example 7.

| Example 8 | 8A | 8B | 8C | 8D | 8E | 8F |
|---|---|---|---|---|---|---|
| SPG-1 | 0.05 | 0.05 | 0.05 | 0.05 | 0.03 | 0.02 |
| Ag-1 | 0.20 | 0.18 | 0.16 | 0.14 | 0.12 | 0.15 |
| SPC-3 | 0.85 | 0.85 | 0.90 | 0.95 | 0.90 | 0.45 |
| Resin PKHC | 0.25 | 0.25 | 0.25 | 0.25 | 0.25 | 0.25 |
| Solvent butyl glycol acetate | 0.75 | 0.75 | 0.75 | 0.75 | 0.75 | 0.75 |
| Initial SR (mOhm/sq at 25 μm) | 18.7 | 19.1 | 19.5 | 19.6 | 20.0 | 104.0 |
| % SR increase | 57.3 | 61.8 | 61.9 | 78.5 | 74.8 | 191.7 |
| Total Filler wt % | 81.5 | 812 | 81.6 | 82 | 80.8 | 71.3 |
| LSA Filler wt % | 18.5 | 17.3 | 15.4 | 13.7 | 11.5 | 19.5 |

Example 9

Performance of Conductive Inks Using Polyurethane and Polyester Resins

Conductive inks were prepared to contain components according to the table for Example 9 using a thermoplastic polyurethane and a polyester as the resins. The thermoplastic polyurethane (TPU) had a glass transition temperature of 23° C. and an elastic modulus of 46.2 MPa (6700 psi), and was sold under the product name ESTANE 5715 from Lubrizol Advanced Materials, Inc. The polyester (PE) had a glass transition temperature of 63° C. and an elastic modulus of 66.2 MPa (9600 psi), and was sold under the product name VITEL 220B from Bostik Findley, Inc. The solvent for the compositions was the dibasic ester, DBE-9, from Invista Specialty Intermediates.

Samples were prepared as described above, except that the tracks were 5 mm×80 mm (width×length) with an average thickness of 25 µm. Samples were cured for 10 minutes at 140° C. The compositions were tested for conductivity and flexibility as described before. The composition formulations (weights in grams) and results are reported in the following table.

| Example - Comparative | 9A | 9B |
|---|---|---|
| SPC-3 | 1.75 | 1.75 |
| Resin TPU | 0.25 | |
| Resin PE | | 0.25 |
| Solvent DBE-9 | 0.75 | 0.75 |
| Initial SR (mOhm/sq at 25 µm) | 0.0265 | 0.039 |
| % SR increase | 74.4 | 132.2 |
| Total Filler wt % | 87.5 | 87.5 |
| LSA Filler wt % | 0 | 0 |

Additional compositions were prepared as previously described using various combinations of large and small surface area conductive fillers. The conductivity and flexibility were measured. The composition formulations (weights in grams) and results are reported in the following table. The data show that the use of LSA conductive fillers enhances the flexibility of flexible resins like PE or TPU while maintaining good electrical performance.

| Example 9 | 9C | 9D | 9E | 9F |
|---|---|---|---|---|
| SPG-1 | | 0.03 | | 0.03 |
| Ag-1 | 0.6 | 0.12 | 0.6 | 0.12 |
| SPC-3 | 0.65 | 0.9 | 0.65 | 0.9 |
| Resin TPU | 0.25 | 0.25 | | |
| Resin PE | | | 0.25 | 0.25 |
| Solvent DBE-9 | 0.75 | 0.75 | 0.75 | 0.75 |
| Initial SR (mOhm/sq at 25 µm) | 23 | 32 | 14 | 43 |
| % SR increase | 23.4 | 41.2 | 80.5 | 118 |
| % Improvement over comparative ex 9A | 68.5% | 44.6% | | |
| Improvement over comparative ex 9B | | | 39.1% | 10.7% |
| Total Filler wt % | 83.3 | 80.8 | 83.3 | 80.8 |
| LSA Filler wt % | 40 | 11.5 | 40 | 11.5 |

The invention claimed is:

1. A flexible conductive ink composition comprising
  (A) a resinous binder, in an amount of from 2 to 60 wt. %, based on the weight of the dry composition, the resins of said binder being thermoplastic resins selected from the group consisting of phenoxy resins, polyesters, and thermoplastic urethane;
  (B) silver-plated core conductive particles smaller than 1.0 m$^2$/g, and
  (C) conductive particles having a surface area of at least 1.0 m$^2$/g and a particle size of 1 to 100 µm,
  wherein silver-plated core conductive particles (B) are present in an amount from 30 to 92 wt % of the total dry composition, and conductive particles having a specific surface area at least 1.0 m2/g (C) are present in an amount from 3 to 60 wt % of the total dry composition, and wherein the flexibility of the ink composition is higher than the flexibility of the composition without (C) conductive particles,
  and wherein the composition does not comprise a curing agent for the resin binder.

2. The flexible conductive ink composition according to claim 1 in which the resin binder is a phenoxy resin.

3. The flexible conductive ink composition according to claim 1 in which the core of the silver-plated core conductive particles is selected from the group consisting of copper, nickel, palladium, carbon black, carbon fiber, graphite, aluminum, indium tin oxide, glass, polymer, antimony doped tin oxide, silica, alumina, fiber, and clay.

4. The flexible conductive ink composition according to claim 1 in which the core of the silver-plated core conductive particles is copper.

5. The flexible conductive ink composition according to claim 1 in which conductive particles having a surface area at least 1.0 m$^2$/g are selected from the group consisting of silver, gold, palladium, platinum, carbon black, carbon fiber, graphite, indium tin oxide, silver-plated nickel, silver-plated copper, silver-plated graphite, silver-plated aluminum, silver-plated fiber, silver-plated glass, silver-plated polymer, and antimony-doped tin oxide.

6. The flexible conductive ink composition according to claim 1 in which conductive particles having a surface area at least 1.0 m$^2$/g are metal-coated core particles.

7. The flexible conductive ink composition according to claim 1 further comprising a solvent.

8. The flexible conductive ink composition according to claim 7 in which the solvent is selected from the group consisting of butyl glycol acetate, 1,4-butanediol diglycidyl ether, p-tert-butyl-phenyl glycidyl ether, allyl glycidyl ether, glycerol diglycidyl ether, butyldiglycol, 2-(2-butoxy-ethoxy)-ethylester, acetic acid, 2-butoxyethylester, butylglycol, 2-butoxyethanol, isophorone, 3,3,5 trimethyl-2-cyclohexene-1-one, dimethylsuccinate, dimethylglutarate, dimethyladipate, acetic acid, dipropylene glycol (mono) methyl ether, propylacetate, glycidyl ether of alkyl phenol, and dimethyl esters of adipic, glutaric, and succinic acids.

9. The flexible conductive ink composition according to claim 7 in which the solvent has a flash point above 70° C.

10. The flexible conductive ink composition according to claim 9 in which the solvent is selected from the group consisting of butyl glycol acetate, carbitol acetate, glycol ether, the dimethyl esters of adipic, glutaric, and succinic acids, and ethyl glycol.

11. The flexible conductive ink composition according to claim 10 in which the solvent is selected from the group consisting of butyl glycol acetate and the dimethyl esters of adipic, glutaric, and succinic acids.

12. A process for making an electronic device with the conductive composition of claim 1 comprising applying the conductive composition onto a substrate to form conductive traces or electronic circuitry, and curing and/or drying said conductive composition at about 90° C. to 180° C. for 5 to 60 minutes.

* * * * *